United States Patent
Chaintreuil et al.

(10) Patent No.: US 10,777,991 B2
(45) Date of Patent: Sep. 15, 2020

(54) METHOD AND DEVICE FOR EVALUATING THE ENERGY PRODUCED BY AN ELECTRIC ARC IN A PHOTOVOLTAIC INSTALLATION

(71) Applicants: COMMISSARIAT A L'ENERGIE ATOMIQUE ET AUX ENERGIES ALTERNATIVES, Paris (FR); SOCOMEC, Benfeld (FR)

(72) Inventors: Nicolas Chaintreuil, Montmelian (FR); Stéphane Siat, Obenheim (FR)

(73) Assignees: COMMISSARIAT A L'ENERGIE ATOMIQUE ET AUX ENERGIES ALTERNATIVES, Paris (FR); SOCOMEC, Benfeld (FR)

( * ) Notice: Subject to any disclaimer, the term of this patent is extended or adjusted under 35 U.S.C. 154(b) by 288 days.

(21) Appl. No.: 15/780,119

(22) PCT Filed: Dec. 1, 2016

(86) PCT No.: PCT/EP2016/079469
§ 371 (c)(1),
(2) Date: May 30, 2018

(87) PCT Pub. No.: WO2017/093423
PCT Pub. Date: Jun. 8, 2017

(65) Prior Publication Data
US 2018/0375319 A1    Dec. 27, 2018

(30) Foreign Application Priority Data
Dec. 1, 2015  (FR) ...................................... 15 61623

(51) Int. Cl.
*H02H 1/00* (2006.01)
*H02S 50/10* (2014.01)
(Continued)

(52) U.S. Cl.
CPC ............ *H02H 1/0015* (2013.01); *G01R 22/10* (2013.01); *G01R 31/1272* (2013.01); *H02H 7/20* (2013.01);
(Continued)

(58) Field of Classification Search
CPC ....... H02S 50/00; H02S 50/15; H02H 1/0015; H02H 1/0092; H02H 7/20
(Continued)

(56) References Cited

U.S. PATENT DOCUMENTS 9,389,272 B2    7/2016  Chaintreuil et al.
2009/0308734 A1*  12/2009  Krauss .............. H01J 37/32935
                                                       204/192.13

(Continued)

FOREIGN PATENT DOCUMENTS

FR         3 002 645 A1    8/2014

OTHER PUBLICATIONS

Yao et al., "The Detection of DC Arc Fault: Experimental Study and Fault Recognition", XP32127899, Applied Power Electronics Conference and Exposition (APEC), 2012 27th Annual IEEE, IEEE, Feb. 5, 2012, pp. 1720-1727; cited in the ISR (in English).
(Continued)

*Primary Examiner* — Kevin J Comber
(74) *Attorney, Agent, or Firm* — Westerman, Hattori, Daniels & Adrian, LLP (57) ABSTRACT

The method comprises the steps of measuring (E0) a voltage signal at the terminals of at least one photovoltaic module of the installation (100) with a sampling frequency greater than or equal to 50 kHz and, from the measured voltage signal, determining an initial voltage preceding the appearance of the arc and voltage values during the electric arc; evaluating values of an electric current produced by the photovoltaic installation during the electric arc; time integration (E7) of
(Continued)

the product of arc voltage values equal to the difference between the voltage values during the arc and the initial voltage, determined in step A), and current values evaluated in step B), in order to determine the energy of the arc.

19 Claims, 5 Drawing Sheets

(51) Int. Cl.
*H02S 50/00* (2014.01)
*H02S 40/30* (2014.01)
*G01R 22/10* (2006.01)
*G01R 31/12* (2020.01)
*H02H 7/20* (2006.01)

(52) U.S. Cl.
CPC .............. *H02S 40/30* (2014.12); *H02S 50/00* (2013.01); *H02S 50/10* (2014.12)

(58) Field of Classification Search
USPC .......................................................... 361/87
See application file for complete search history.

(56) References Cited

U.S. PATENT DOCUMENTS

| | | |
|---|---|---|
| 2011/0141644 A1* | 6/2011 | Hastings .............. H02H 1/0015 361/93.2 |
| 2011/0267721 A1 | 11/2011 | Chaintreuil et al. |
| 2012/0134058 A1 | 5/2012 | Pamer et al. |
| 2015/0357972 A1 | 12/2015 | Lespinats et al. |

OTHER PUBLICATIONS

Koziy et al., "A Low-Cost Power-Quality Meter With Series Arc-Fault Detection Capability for Smart Grid", XP11515987, IEEE Transactions on Power Delivery, vol. 28, No. 3, Jul. 2013, pp. 1584-1589; cited in the ISR (in English).

Schimpf et al., "Recognition of Electric Arcing in the DC-wiring of Photovoltaic Systems", XP31579534, Intelec 09: 31st International Telecommunications Energy Conference; Incheon, Korea, Oct. 18-22, 2009, IEEE, Piscataway, NJ, Oct. 18, 2009, 6 pages; cited in the ISR (in English).

International Search Report and Written Opinion dated Jan. 17, 2017 issued in corresponding application No. PCT/EP2016/079469; w/ English partial translation and partial machine translation (21 pages).

* cited by examiner

METHOD AND DEVICE FOR EVALUATING THE ENERGY PRODUCED BY AN ELECTRIC ARC IN A PHOTOVOLTAIC INSTALLATION

TECHNICAL FIELD OF THE INVENTION

The invention relates to a method and a device for evaluating the energy produced by an electric arc in a photovoltaic installation. It also relates to a photovoltaic installation equipped with such a device.

PRIOR ART

Electric arcs are liable to occur in photovoltaic installations.

An electric arc may occur in the event of a conductor fault or in the event of a faulty connection (for example following the opening of a live connector or on account of corrosion of a conductor). It is formed by a plasma that appears between two electrodes. Said electrodes may be formed by the two ends of a conductor or by two parts of a connector that is open or locally interrupted (on account of corrosion for example). The appearance of an electric arc is accompanied by a positive voltage jump or edge of short duration, of the order of a few microseconds. The initial arc voltage $V_{arc0}$ has a value that is characteristic of the appearance of an electric arc and that depends on the material of the electrodes. It is generally between 10 V and 30 V. For example, in the case of electrodes made of copper, the initial arc voltage $V_{arc0}$ is of the order of 20 V. The plasma of the electric arc performs the role of a resistance that increases over time. The initial voltage edge is therefore generally followed by a gradual increase in the arc voltage, which may continue until it reaches an open circuit voltage.

Photovoltaic installations have the feature that they operate with DC electric current and voltage, which may prove problematic in the event of the appearance of an electric arc linked to a fault. Specifically, with DC current and voltage, there is no natural quenching of the electric arc through a zero-crossing of the voltage and of the current, as is the case with AC current. The result of this is that an electric arc linked to a fault is liable to generate a plasma that releases a very large amount of heat for a significant period, and that therefore produces a lot of energy within a photovoltaic installation. Such a plasma is destructive and may start a fire. For safety reasons, it is therefore essential to detect the presence of a possible electric arc within a photovoltaic installation and to interrupt it in good time in order to prevent any damage or starting of a fire. To this end, the photovoltaic installation is equipped with an arc detection device, or arc detector. The latter is generally associated with an intervention or arc-quenching device that is intended to intervene so as to interrupt the electric arc and prevent any damage or starting of a fire.

An electric arc may also occur, during normal operation, in an electromagnetic control and/or protection unit, upon opening or upon closure of contacts or poles. For example, upon opening, a disconnecting switch generates an electric arc of a duration less than or equal to a known maximum duration. Arc-quenching means generally make it possible to interrupt the arc so that it does not last beyond a predefined maximum arc duration.

There are various methods, some of which are very fast, for detecting the presence of an electric arc in a photovoltaic installation. In the event of an electric arc linked to the opening of a disconnecting switch or other electromechanical unit when live, this risks causing a positive arc detection followed by unwanted shutdown of the photovoltaic installation, which is not desirable.

Moreover, an electric arc linked to a fault in the photovoltaic installation may have a duration that may range from a few microseconds to several minutes, or even several hours under certain particular conditions. For example, in the event of a discontinuous electric arc formed of a succession of micro-arcs of short durations and that are separated by periods without an arc, each micro-arc is not a priori dangerous in itself, but the energy accumulated by the succession of these micro-arcs may become critical for the environment and/or the installation over time.

For the reasons that have just been outlined, it appears to be useful to evaluate the level of electrical energy generated by an electric arc, for the purpose in particular of ascertaining the danger thereof to the photovoltaic installation and/or the environment.

SUBJECT OF THE INVENTION

To this end, the invention relates to a method for evaluating the electrical energy produced by an electric arc in a photovoltaic installation, comprising the following steps:
A) Measuring an electric voltage signal across the terminals of at least one photovoltaic module of the installation at a sampling frequency greater than or equal to 50 kHz and, from the measured voltage signal:
  Determining an initial voltage before the arc appears;
  Determining voltage values during the electric arc;
B) Evaluating values of electric current produced by the photovoltaic installation during the electric arc;
C) Integrating, over time, the product of arc voltage values that are equal to the difference between the voltage values during the arc and the initial voltage, which values are determined in step A), and current values evaluated in step B), in order to determine the energy of the arc.

According to the invention, the arc energy, that is to say the electrical energy generated by an electric arc occurring within the photovoltaic installation, is evaluated simply from the voltage across the terminals of one or more photovoltaic modules of the installation, which voltage is measured at a high sampling frequency.

In one particular embodiment, to evaluate a current value during the arc, an initial electric current before the electric arc is determined, and there is subtracted, from said initial current, an arc voltage value, which is equal to the difference between a voltage value determined in step A) and the initial voltage, multiplied by the ratio between the magnitude of a current jump linked to the appearance of the arc and the magnitude of a voltage jump linked to the appearance of the arc. Thus, after the arc appears, it is considered that the current varies linearly as a function of the voltage. Advantageously, the magnitude of the current jump is equal to a predefined percentage of x % of the initial current, x being between 6% and 8%, in particular equal to 7%.

The value of the voltage jump may be predefined and between 12 V and 35 V, for example equal to 20 V.

In one variant embodiment, the current values evaluated during the arc are values measured at a sampling frequency less than or equal to 1 Hz.

Advantageously, the method comprises a step of breaking down the voltage signal into a plurality of acquisition windows, each window containing a number $N_f$ of acquisition points corresponding to sampled voltage values, and, for each acquisition window, a step of determining an average value of the voltage measured over said window.

Again advantageously, the initial voltage before the arc appears is determined by calculating an average of a plurality of average voltage values in relation to a plurality of acquisition windows before the electric arc.

In a first particular embodiment, the voltage values determined during the electric arc are equal to average voltage values in relation to a succession of acquisition windows.

In a second particular embodiment, the following are calculated:
an average arc voltage $V_{arctot}$, by calculating the average of a plurality of arc voltage values determined in relation to a plurality n of acquisition windows covering the electric arc,
an average current $I_{arctot}$ during the electric arc, by calculating the average of a plurality of current values evaluated for the plurality n of acquisition windows;
the total energy produced by the arc $E_{arctot}$ using the relationship: $E_{arctot}=$ $$V_{arctot} \times I_{arctot} \times n \times \frac{1}{F_{ech}} \times N_f$$

where n, $F_{ech}$ and $N_f$ represent the number of acquisition windows during the arc, the sampling frequency of the measured voltage and the number of acquisition points in an acquisition window, respectively.

In a third embodiment, the following are calculated:
the arc energy produced by the arc during each acquisition window of index arcj using the relationship $$E_{Farcj} = V_{arcj} \times I_{Farcj} \times \frac{1}{F_{ech}} \times N_f$$

where $V_{arcj}$, $I_{Farcj}$, $F_{ech}$ and $N_f$ represent an average arc voltage calculated for the window of index arcj, an average current evaluated for the window of index arcj, the sampling frequency of the measured voltage and the number of acquisition points in an acquisition window, respectively;
the total energy produced by the arc $E_{arctot}$ by summing the arc energies produced over a plurality n of acquisition windows covering the electric arc.

Advantageously, in the event of a discontinuous electric arc including a plurality of micro-arcs, the energy of each electric micro-arc is determined, and then the respective energies of the electric micro-arcs are summed in order to determine the energy of the discontinuous electric arc.

Again advantageously, the method comprises a step of comparing the determined energy of the electric arc with an energy threshold, and a protection step if this threshold is exceeded.

The invention also relates to a device for evaluating the energy released by an electric arc in a photovoltaic installation, characterized in that it comprises:
a module for obtaining an electric voltage signal measured across the terminals of at least one photovoltaic module of the installation at a sampling frequency greater than or equal to 50 kHz;
a module for determining an initial electric current produced by the photovoltaic installation before the arc appears;
a module for processing the voltage signal, designed to determine, from the measured voltage signal:
an initial voltage before the arc appears;
voltage values during the electric arc;
a module for evaluating values of electric current produced by the photovoltaic installation during the electric arc;
a module for integrating, over time, the product of arc voltage values that are equal to the difference between the voltage values during the arc and the initial voltage, which values are determined by the processing module, and current values evaluated by the evaluation module, in order to determine the energy of the arc.

The invention also relates to a safety system for a photovoltaic installation, characterized in that it comprises a device for detecting an electric arc, a device for evaluating the electrical energy produced by a detected electric arc, such as defined above, and an intervention device intended to protect the photovoltaic installation.

The invention relates lastly to a photovoltaic installation including such a safety system.

BRIEF DESCRIPTION OF THE DRAWINGS

The invention will be better understood with the aid of the following description of one particular embodiment of the method and of the device for evaluating the electrical energy produced or generated by an electric arc in a photovoltaic installation, of a safety system for a photovoltaic installation incorporating such an evaluation device, and of a photovoltaic installation equipped with this safety system, with reference to the appended drawings, in which.

DETAILED DESCRIPTION OF PARTICULAR EMBODIMENTS OF THE INVENTION

The invention aims to evaluate the electrical energy generated or produced by an electric arc occurring within a photovoltaic installation 100.

Figure 1:
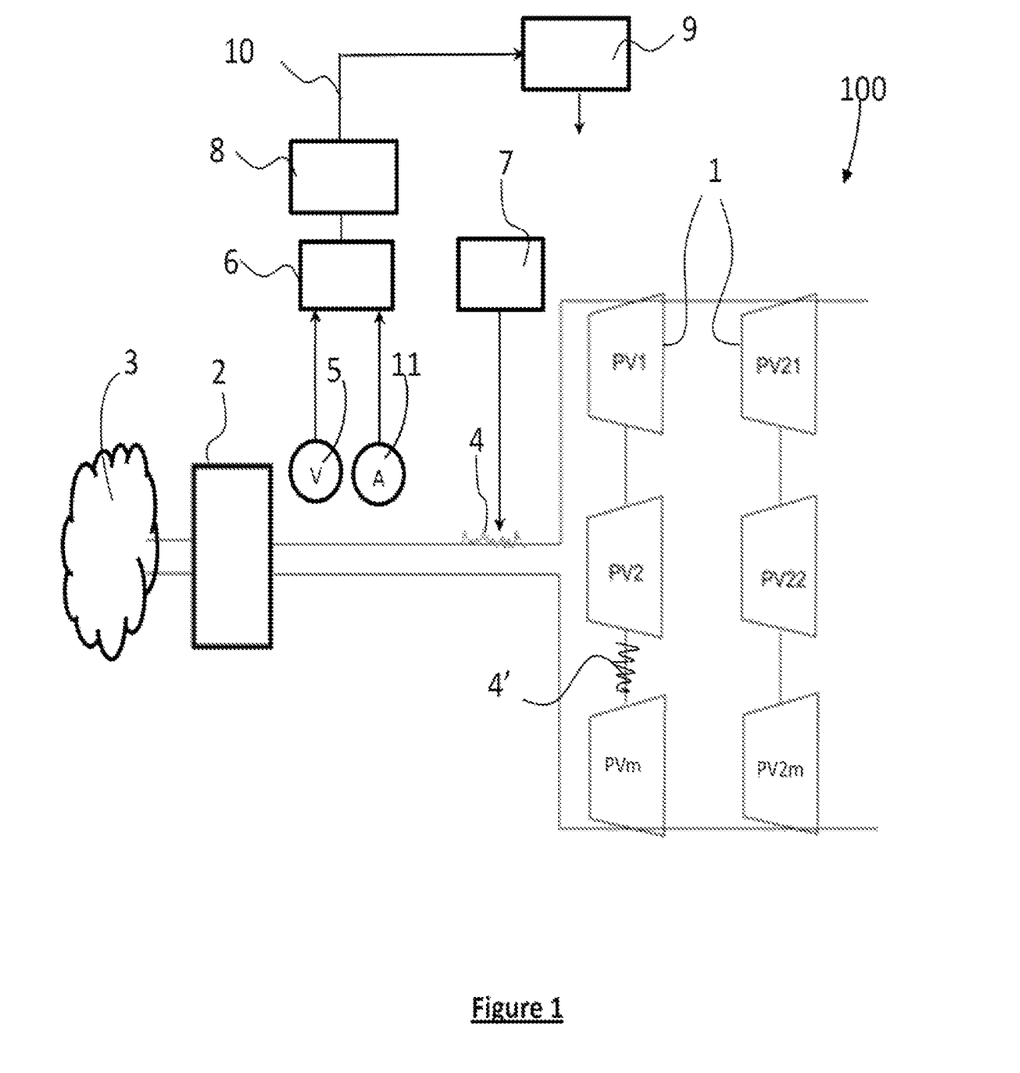
FIG. 1 shows a diagram of a photovoltaic installation according to one exemplary embodiment of the invention.

FIG. 1 schematically shows an example of a photovoltaic installation 100 able to produce a DC current I. Said installation comprises, in a known manner, a plurality of photovoltaic (PV) modules 1 linked to an inverter 2. The PV modules 1 are identical in this case. The PV modules 1 may be connected in series, in parallel or in a combination of both. A chain of PV modules connected in series is called a 'string'. For example, as shown in FIG. 1, the installation 100 comprises a plurality of strings, or chains, of m PV modules 1 that are connected in parallel. The inverter 2 is intended to convert the DC current I produced by the photovoltaic modules 1 into an AC current, and to supply this to an electrical grid 3.

The method of the invention seeks to evaluate the electrical energy produced by an electric arc whose presence is detected within a photovoltaic installation 100.

An electric arc may be linked to a fault, and may occur at any location in the installation 100, for example between the photovoltaic modules 1 and the inverter 2 (as shown by the electric arc 4 in FIG. 1), or within a photovoltaic module 1, or else on a link linking a plurality of photovoltaic modules 1 in series (as shown by the electric arc 4' in FIG. 1). An electric arc may also occur during normal operation of the installation 100, within an electromechanical unit, for example within a disconnecting switch (not shown in FIG. 1), upon opening of the contacts of the latter when live. In this case, the unit is equipped with arc-quenching means that make it possible to quench the electric arc quickly.

An electric arc, whether it is linked to a fault or not, causes a significant voltage variation within the electrical installation 100. Specifically, the appearance of the electric arc is characterized by a positive voltage jump or edge, of a duration of the order of a few microseconds and with a magnitude equal to a characteristic initial arc voltage $V_{arc0}$. The value of this initial arc voltage $V_{arc0}$ is typically between 12 V and 35 V. It depends on the material forming the electrodes between which the electric arc forms. For example, if the electrodes are made of copper, the initial arc voltage $V_{arc0}$ is equal, or substantially equal, to 20 V.

Figure 4:
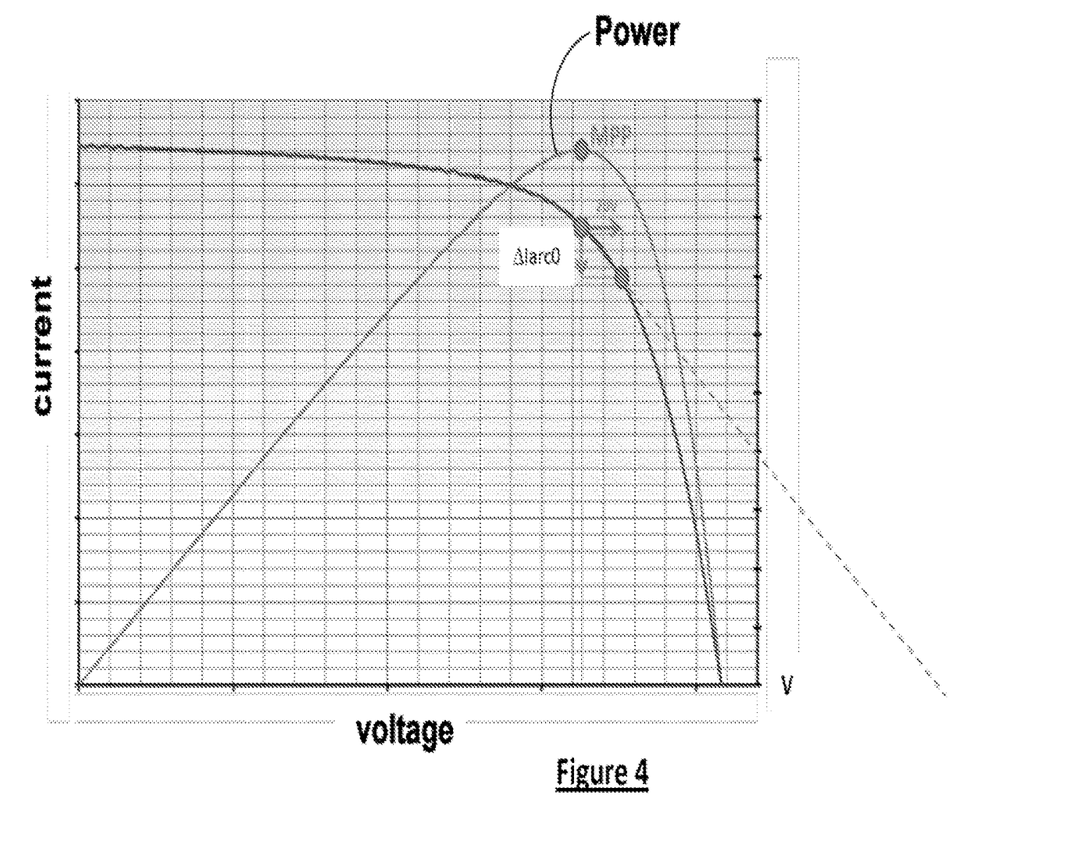
FIG. 4 shows an example of the current-voltage characteristic of a photovoltaic module of the installation of FIG. 1 and the corresponding power curve as a function of the voltage.

When an electric arc appears in the photovoltaic installation 100, be it an electric arc linked to a fault (for example the arc 4 or 4') or an electric arc linked to the opening of the disconnecting switch when live, the voltage across the terminals of each photovoltaic module 1, or of a chain (or string) of m modules 1 in series, increases sharply on account of the initial arc voltage $V_{arc0}$ (in the scenario where the arc occurs outside of the module(s) under consideration). The voltage across the terminals of a string of m modules increases by $V_{arc0}$, and the voltage across the terminals of each module of the string increases by $V_{arc0}/m$. If it is considered that m is equal to 20, then the appearance of the electric arc causes an increase of 1 V for the voltage across the terminals of each PV module 1. This voltage jump brings about a variation of the operating point of the PV modules 1 and/or of the string. The result of this is that current I produced by the photovoltaic installation drops sharply by a value $\Delta I_{arc0}$, as is seen in FIG. 4. This value $\Delta I_{arc0}$ depends on the position of the operating point on the current-voltage curve, or I-V characteristic curve, of the photovoltaic module(s). FIG. 4 shows a voltage jump $V_{arc0}$ of 20 V across the terminals of a string of a plurality of photovoltaic modules 1, operating at the maximum power point MPP, and the corresponding current jump $\Delta I_{arc0}$, which jumps are caused by the appearance of an electric arc.

Figure 2:
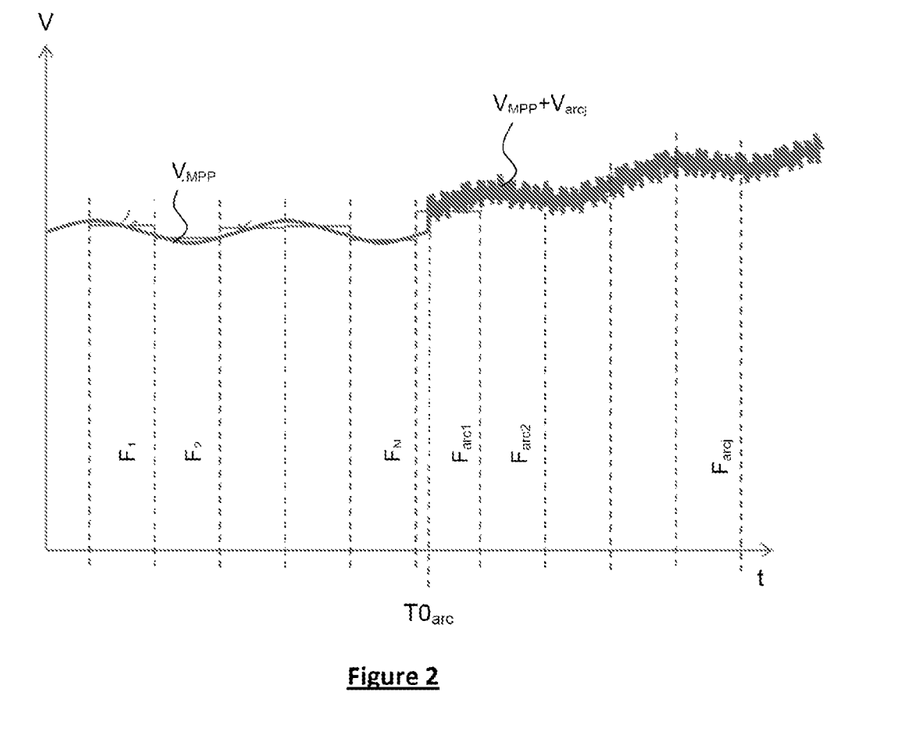
FIG. 2 shows an example of a measured signal of the electric voltage across the terminals of one or more photovoltaic modules of the installation of FIG. 1, incorporating a voltage jump linked to the appearance of an electric arc and broken down into acquisition windows.

FIG. 2 shows a first example of an electric voltage signal V across the terminals of one or more PV modules 1 of the photovoltaic installation 100 and measured by a voltage measurement sensor 5. This signal incorporates a positive voltage jump linked to the appearance of a continuous electric arc of long duration that is caused by a fault. The voltage signal is broken down into a succession of acquisition windows denoted:

$F_i$, where $1 \leq i \leq N$, before the arc appears, and $F_{arcj}$, where $1 \leq j \leq n$, to be counted when the arc appears, n being the number of windows concomitant with the arc.

Figure 3:
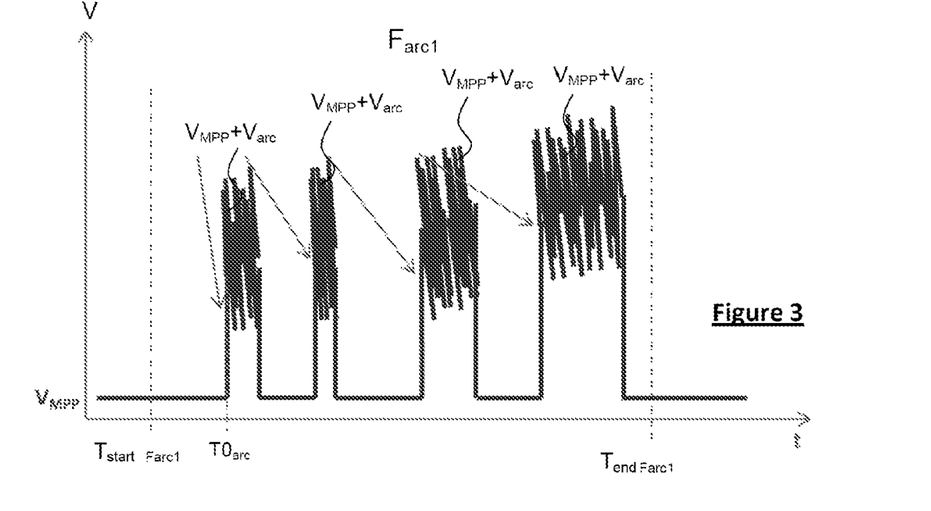
FIG. 3 shows a second example of an electric voltage signal across the terminals of one or more photovoltaic modules of the installation of FIG. 1, incorporating a voltage jump linked to the appearance of a discontinuous electric arc.

FIG. 3 shows a second example of an electric voltage signal V produced by the photovoltaic installation 100 and measured by a voltage measurement sensor. The signal incorporates a positive voltage jump linked to the appearance of a discontinuous electric arc including a succession of micro-arcs (that is to say of electric arcs of short duration, typically of between 2 μs and 100 μs) that are separated by periods without an arc. The voltage signal is broken down into a succession of acquisition windows. In FIG. 3, only the acquisition window containing the start of the electric arc is shown. An electric arc of this type is generally linked to a connection fault (contact oxidation, weld break, unscrewed terminal, etc.). In the presence of such a connection fault, electrodes form but remain, through construction, very close to one another, or even in random contact, thereby leading to random electrical connections. An electric arc may appear between these electrodes and last between a few microseconds and a few hundred microseconds. Through melting of the electrode materials, a solder bridge may be created, thus re-establishing electrical contact between the electrodes, and then break again under the Joule effect of the current, thus causing the appearance of a new arc of short duration. This alternation of appearance and disappearance of an arc of short duration may be repeated several times and thus generate a succession of electric arcs of short durations that are separated by periods without an arc.

The photovoltaic installation 100 furthermore comprises a sensor 5 for measuring the electric voltage V across the terminals of one or more PV modules of the installation 100, for example across the terminals of a chain of m PV modules 1 (or as a variant across the terminals of each PV module 1), a current measurement sensor 11, an electric arc detection device 7, a device 8 for evaluating the energy released by a detected electric arc, and an intervention or protection device 9. A plurality of voltage measurement sensors may be provided for measuring the voltages at various locations in the photovoltaic installation. For the sake of clarity, just one measurement sensor 5 is considered in the following description.

The voltage measurement sensor 5 operates at a high sampling frequency, in this case greater than or equal to 50 kHz. In the example described here, the sampling frequency is equal to 200 kHz. The measurement sensor 5 is linked to a buffer memory 6 for storing the measured voltage signal.

The current measurement sensor 11 in this case operates at a low sampling frequency (less than or equal to 1 Hz). It is intended in particular to supply one or more measurements of the initial current before a detected electric arc appears. The current signal is also recorded in the buffer memory 6. The sensor 11 is for example positioned at the input of the inverter 2.

The role of the electric arc detection device 7 is to detect an electric arc occurring in the photovoltaic installation 100. It is designed to implement an electric arc detection method that is preferably capable of quickly detecting the appearance of an electric arc, preferably within a maximum period of a few hundred microseconds after this appearance. The detection method may be based for example on the detection of a positive voltage jump, as described for example in patent document FR3002645. With the installation being equipped with the high-frequency voltage measurement sensor 5, the electric arc detection could advantageously use the voltage measurement signal supplied by this sensor 5.

Figure 6:
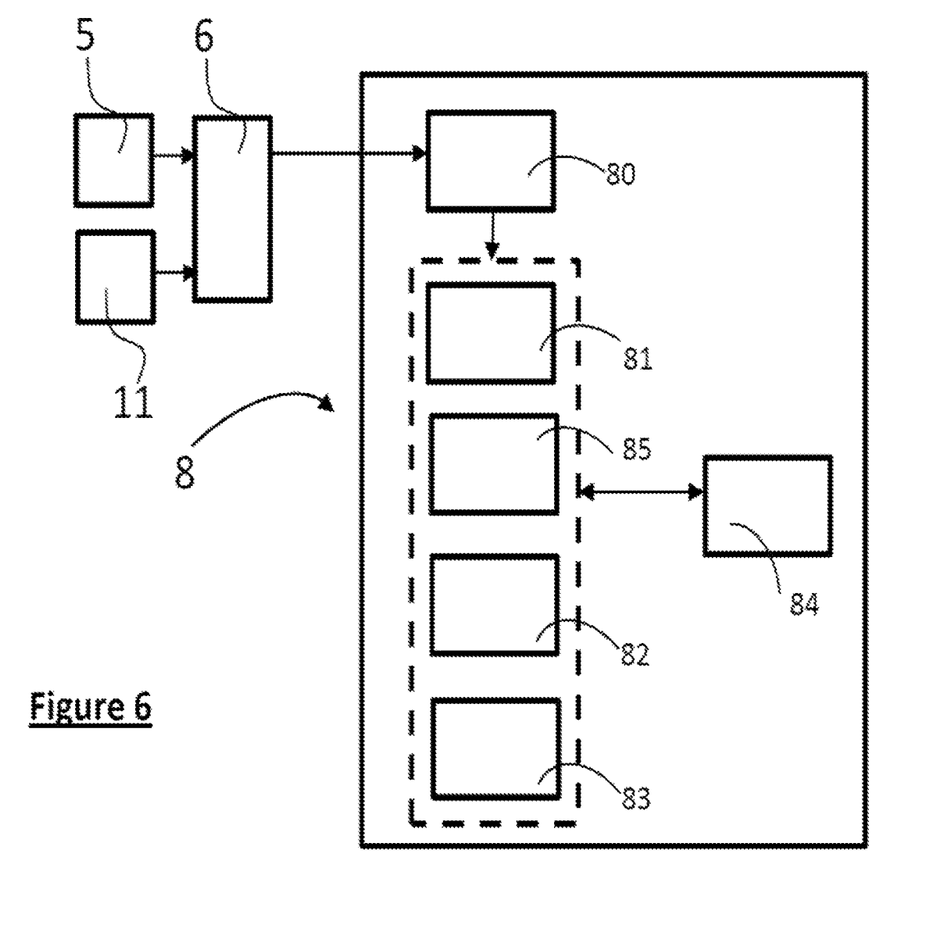
FIG. 6 shows a functional block diagram of the evaluation device according to one particular embodiment of the invention, designed to implement the method of FIG. 5.

The role of the device 8 for evaluating the electrical energy produced by a detected electric arc is to evaluate the amount of electrical energy produced by an electric arc detected by the detection device 8. It comprises the following modules:
- a module 80 for obtaining an electric voltage signal measured by the sensor 5 and the current signal measured by the sensor 11, linked to the memory 6;
- a processing module 81 able to process the voltage signal and the current signal;
- a module 82 for evaluating the electric current during the electric arc;
- a module 83 for determining the energy of the arc by integrating, over time, the product of the measured voltage and the evaluated current;
- a processing or control unit 84, in this case a microprocessor, to which all of the modules 80 to 83 are linked and that is intended to control operation;
- a memory 85.

The processing module 81 is intended, from the measured voltage signal, to determine:
- an initial voltage before the electric arc appears;
- voltage values during the electric arc.

It is set up to break down the voltage signal into a plurality of acquisition windows $F_x$. Each window contains a number $N_f$ of acquisition points (that is to say of measured/sampled voltage values). For each acquisition window $F_x$, the module 81 calculates an average value of the voltage measured over the window, denoted $V_{Fx}$ for the window $F_x$. The average voltage values $V_{Fx}$ in relation to the acquisition windows $F_x$ are recorded in the memory 85. Thus, the voltage values determined during the arc, denoted $V_{Farcj}$, correspond to the average voltage values calculated in relation to the acquisition windows, denoted $F_{arcj}$, concomitant with the electric arc.

To calculate the initial voltage before the arc, the module 81 calculates the average of the voltages $V_{Fi}$ determined over a plurality of acquisition windows $F_i$ before the arc, for example over a number of windows between 10 and 20. In the scenario where the PV modules 1 are operating at their maximum power point before the arc appears, the determined initial voltage is equal or substantially equal to the voltage $V_{MPP}$ of this maximum power point (in relation to one or PV modules in series). The initial voltage $V_{MPP}$ is recorded in the memory 85.

The module 82 is intended to evaluate values of electric current produced by the photovoltaic installation 100 during the electric arc from a determined initial current $I_0$ (before the arc), from voltage values $V_{Farcj}$ determined during the arc and from the determined initial voltage, as will be described in the description of the method.

The modules 81, 82 and 83 are software modules intended to be executed by the processing unit 84 in order to implement the steps of the evaluation method that will be described further on. The processing unit 84 is also intended to transmit a protection order to the intervention device 9, in the event of detection of an electric arc, in particular of an electric arc that has released a critical energy.

The role of the intervention device 9 is to interrupt such an electric arc in order to prevent any risk of damage or of fire. The energy evaluation device 8 is linked to the intervention device 9 by a communication link 10.

The electric arc detection device 7, the device 8 for evaluating the energy released by the detected electric arc and the intervention device 9 form a safety system for the photovoltaic installation 100.

A description will now be given of the method for evaluating the energy released by an electric arc detected in the photovoltaic installation 100, according to various embodiments.

Figure 5:
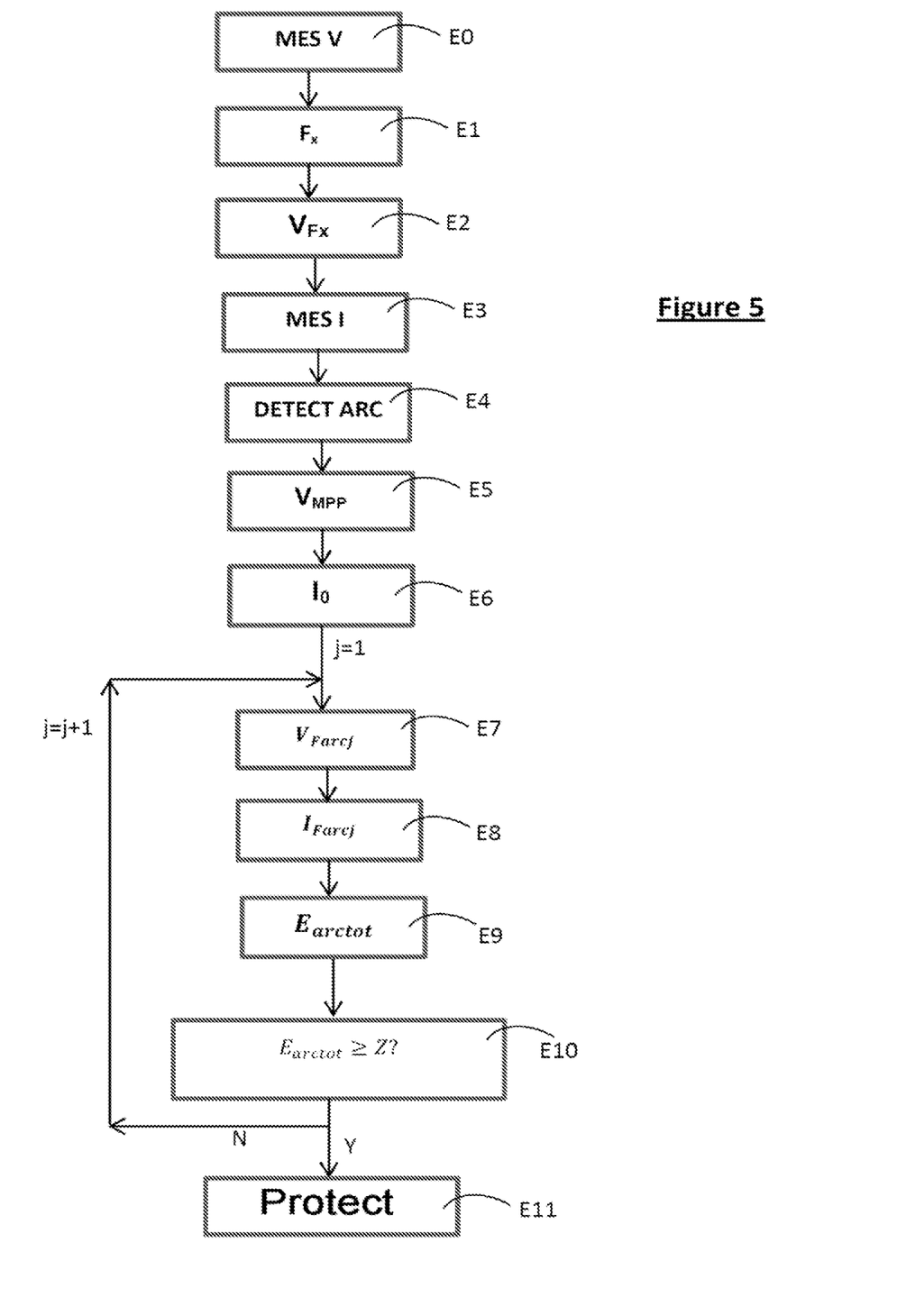
FIG. 5 shows a flow chart of the steps of the evaluation method, according to one particular embodiment of the invention.

With reference to FIG. 5, the method comprises a step E0 of acquisition or of measurement, by the measurement sensor 5, of an electric voltage signal V in this case across the terminals of a chain or string of m photovoltaic modules 1 of the installation 100 at a high sampling frequency, for example equal to 200 kHz. As a variant, the voltage across the terminals of a single PV module or preferably across the terminals of each PV module could be measured. The measured voltage signal is in this case recorded in memory 6 and is thus able to be recovered by the module 80 of the energy evaluation device 8.

The measured voltage signal V is broken down into a succession of acquisition windows $F_x$ in a step E1, by the processing module 81. Each acquisition window contains a predefined number $N_f$ of measured and sampled voltage values (or acquisition points). The acquisition windows contain a given number $N_f$ of acquisition points, and therefore a fixed duration, greater than or equal to 1 ms. For each acquisition window, the processing module 81 calculates an average value of the voltage measured over the window, denoted $V_{Fx}$, by averaging the acquisition points of the window, in a step E2. These average voltage values $V_{Fx}$ are stored in memory 85.

The method also comprises a step E3 of measuring the current, at a low sampling frequency, in this case less than 1 Hz. The measured current values are recorded in memory 6.

Steps E0 to E3 may be implemented throughout the operation of the photovoltaic installation 100.

The method also comprises a step E4 of detecting an electric arc, implemented by the arc detection device 7. This detection step E4 aims to detect an electric arc occurring in the photovoltaic installation 100. As indicated previously, the detection may be based on any known electric arc detection method, which is preferably designed to detect the arc quickly, within a maximum period of a few hundred microseconds after it appears.

It is assumed that an electric arc, for example an electric arc such as the one shown in FIG. 2, is detected in step E4. The instant at which the electric arc appears is denoted $T0_{arc}$. At this instant $T0_{arc}$, a positive voltage jump occurs in the voltage signal, as appears in FIG. 2. $F_i$, where $1 \leq i \leq N$ denotes the windows prior to the appearance of the arc, $F_{arc1}$ denotes the window containing a voltage jump linked to the appearance of the arc, and $F_{arcj}$, where j ranges from 2 to n, denotes the windows following the appearance of the arc and that are concomitant with the arc. Moreover, $V_{Fi}$ denotes the average of the voltage over the window $F_i$ before the arc and $V_{Farcj}$ denotes the average of the voltage over the window $F_{arcj}$ after the arc.

Following the detection E4 of the electric arc, the method comprises the following steps of:
- determining E5 an initial voltage $V_{MPP}$ before the arc appears;
- determining E6 an initial electric current $I_0$ produced by the installation 100 before the arc appears;
- determining E7 voltage values during the arc, denoted $V_{Farcj}$, where j=1, 2, etc.;
- evaluating E8 values of electric current produced by the installation 100 during the arc, denoted $I_{Farcj}$, where j=1, 2, etc., from the initial current $I_0$, from the voltage values $V_{Farcj}$ determined during the arc and from the determined initial voltage $V_{MPP}$, determining E9 the energy of the arc $E_{arctot}$ by integrating, over time, the product of arc voltage values, which values are equal to the difference between the voltage values $V_{Farcj}$ determined during the arc and the determined initial voltage $V_{MPP}$, and the evaluated current values.

It is assumed in this case that the PV modules 1 of the photovoltaic installation 100 are operating at their maximum power point $V_{MPP}$ before the electric arc appears. To determine the initial voltage $V_{MPP}$ (step E5), the processing module 81 in this case calculates the average of a plurality of average voltage values $V_{Fi}$ in relation to a plurality of acquisition windows before the electric arc. For example, it calculates the average of around ten voltage values $V_{Fi}$ that are determined before the arc.

The determined initial electric current $I_0$ (step E6) is equal to a current value measured by the sensor 11 before the arc appears or to the average of a plurality of current values measured by the sensor 11 before the arc appears.

The voltage values $V_{Farcj}$ determined during the arc (step E7) correspond to the average voltage values in relation to the windows $F_{arcj}$ during the arc, which values are stored in memory 85. It is assumed that each voltage value $V_{Farcj}$ is equal to the initial voltage before the arc, that is to say $V_{MPP}$, plus the arc voltage $V_{arcj}$. In other words, it is assumed that:

$$V_{Farcj} = V_{MPP} + V_{arcj}.$$

In step E8, a current value $I_{Farcj}$ for each window $F_{arcj}$ concomitant with the electric arc is evaluated. To this end, there is subtracted, from the initial current $I_0$ (before the arc appears), the arc voltage value $V_{arcj}$ in relation to the window $F_{arcj}$ multiplied by the ratio between the magnitude (in absolute value) of a current jump $|\Delta I_{arc0}|$ linked to the appearance of the arc and the magnitude of a voltage jump $\Delta V_{arc0}$ linked to the appearance of the arc. The arc voltage $V_{arcj}$ is equal to the difference between the voltage $V_{Farcj}$ determined for the window $F_{arcj}$ and the determined initial voltage $V_{MPP}$. Thus, an evaluation of the current $I_{Farcj}$ for each window $F_{arcj}$ is calculated using the following relationship:

$$I_{Farcj} = I_0 - (V_{Farcj} - V_{MPP}) \times \frac{|\Delta I_{arc0}|}{\Delta V_{arc0}} = I_0 - V_{arcj} \times \frac{|\Delta I_{arc0}|}{\Delta V_{arc0}}$$

It is thus considered that the current $I_{Farcj}$, after the arc appears, varies linearly as a function of the voltage $V_{Farcj}$, in accordance with the half-line shown in FIG. 4. The evaluated current values are recorded in memory 85.

The arc voltage value $V_{arcj}$ in relation to the window $F_{arcj}$ is equal to the difference between the voltage $V_{Farcj}$ determined for the window $F_{arcj}$ and the determined initial voltage $V_{MPP}$.

The magnitude of the voltage jump $\Delta V_{arc0}$ has a known value, as explained above. In this case, it is assumed that $\Delta V_{arc0}$ is equal to 20 V (for a string of PV modules).

According to the invention, it is considered in this case that the magnitude of the current jump $|\Delta I_{arc0}|$ is equal to a predefined percentage of x % of the initial current $I_0$, that is to say of the initial current flowing in the chain of photovoltaic modules affected by the electric arc at the operating point of the photovoltaic installation. The value of x depends on the position of the operating point on the IV curve at the instant when the electric arc occurs. It is able to be extrapolated from measurements of IV curves or derived, for a given photovoltaic installation, from predefined IV curves in relation to the photovoltaic modules of the installation. It is between 6% and 8%, for example. It is assumed in this case that it is equal to 7%.

The integration, over time, of the product of the arc voltage and the current during the arc (step E9) may be implemented in various ways.

In a first embodiment, to calculate the total energy produced by the electric arc, the following are calculated:
an average arc voltage $V_{arctot}$, by calculating the average of a plurality of arc voltage values determined in relation to a plurality $N_{Farc}$ of acquisition windows covering the electric arc,
an average current $I_{arctot}$ during the electric arc, by calculating the average of a plurality of current values evaluated for the plurality $N_{Farc}$ of acquisition windows;
the total energy produced by the arc $E_{arctot}$ using the relationship: $E_{arctot} =$ $$V_{acrtot} \times I_{arctot} \times n \times \frac{1}{F_{ech}} \times N_f$$

where n, $F_{ech}$ and $N_f$ represent the number of acquisition windows during the arc, the sampling frequency of the measured voltage and the number of acquisition points in an acquisition window, respectively.

The average arc voltage $V_{arctot}$ is for example calculated using the following relationship:

$$V_{arctot} = \frac{V_{arc1} + \sum_{F_{arc2}}^{F_{arcn}}(V_{Farcj} - V_{MPP})}{n}$$

To calculate the average arc voltage of the window $F_{arc1}$ containing the voltage jump linked to the appearance of the arc, it is possible to calculate the difference between the average voltage after the voltage edge (or jump) in the arc window $F_{arc1}$ and the average voltage before the voltage edge in the arc window $F_{arc1}$.

The average current $I_{arctot}$ is calculated by averaging the current values evaluated for the acquisition windows during the arc using the relationship:

$$I_{arctot} = \frac{\sum_{F_{arc1}}^{F_{arcn}} I_{Farcj}}{n}$$

In a second embodiment, to calculate the total energy produced by the electric arc, the following are calculated:
the arc energy produced by the arc during each acquisition window of index 'arcj' using the relationship $$E_{Farcj} = V_{arcj} \times I_{Farcj} \times \frac{1}{F_{ech}} \times N_f;$$

the sum of the arc energies produced over a plurality of n acquisition windows covering the electric arc using the relationship $E_{arctot} = \sum_{F_{arc1}}^{F_{arcn}} E_{Farcj}$.

To calculate the arc energy in relation to the window $F_{arc1}$ containing the voltage jump linked to the appearance of the arc, it is possible to estimate the arc voltage $V_{arc1}$ by taking the difference between the average voltage after the voltage edge (or jump) in the arc window $F_{arc1}$ and the average voltage before the voltage edge in the arc window $F_{arc1}$.

In the embodiments that have just been described, the electric current during the arc is evaluated, by linear reconstruction, from the measured initial current and from voltage values determined during the arc. Thus, the evaluation of the energy level of the arc is based on a high-frequency voltage measurement (greater than or equal to 50 kHz) alongside a linear reconstruction of the current.

In one variant embodiment, the current values evaluated during the arc are values measured by way of a current measurement sensor (such as the sensor 111) at a sampling frequency less than or equal to 1 Hz. In this case, the value of the current $I_{Farcj}$ in relation to the window $F_{arcj}$ is equal to a current value measured over a point of the window $F_{arcj}$. Thus, the evaluation of the energy level of the arc is based on a high-frequency voltage measurement (greater than or equal to 50 kHz) alongside an evaluation of the current performed by a low-sampling-frequency current measurement (less than or equal to 1 Hz), of 'monitoring' type.

Step E9 of evaluating the energy $E_{arctot}$ generated or produced by the electric arc may be followed by a test step E10 that makes it possible to check whether the total arc energy is greater than or equal to a critical energy threshold Z (for example expressed in joules). In other words, in step E10, the following test is performed:

$$E_{arctot} \geq Z?$$

For example, the threshold Z is in this case equal to 2 joules. The value of this threshold could however be adjusted depending on the installation and on its environment.

If the test E10 is positive, with the total arc energy having reached or exceeded the threshold Z, the energy evaluation device 8 automatically sends, to the intervention device 9, an order to protect the installation 100. Next, in a step E11, the intervention device 9 protects the photovoltaic installation 100. This protection may be based on remotely controlled switches. It may consist of an order to interrupt the operation of the photovoltaic installation, thereby making it possible to stop the stray electric arc and to eliminate any risk of damage and/or of starting of a fire.

If the test E10 is negative, with the total arc energy being less than the threshold Z, the method continues to evaluate the total energy produced by the electric arc, for a following acquisition window (j=j+1).

As a variant, various levels of criticality of the electric arc could be defined, for example:
  'level 1', corresponding to a total arc energy $E_{arctot}$ strictly less than 1 joule;
  'level 2', corresponding to a total arc energy $E_{arctot}$ greater than or equal to 1 joule and strictly less than 2 joules;
  'level 3', corresponding to a total arc energy $E_{arctot}$ strictly greater than 2 joules.

Level 1 corresponds to an electric arc that does not pose a safety risk. The evaluation device 8 may possibly signal the presence of an electric arc that does not pose a safety risk to an operator. Said operator may decide not to activate the warning for this level.

Level 2 corresponds to an electric arc that does not pose an immediate safety risk, but that could possibly become dangerous. In this case, the evaluation device 8 signals, to the operator, the presence of an electric arc that does not pose an immediate safety risk but requires a quick intervention in order to identify the fault underlying the arc and correct said fault.

Level 3 corresponds to a dangerous electric arc. The evaluation device 8 orders the intervention device 9 to protect the photovoltaic installation 100 immediately, as described above.

In the embodiment that has just been described, the detected electric arc is a continuous arc of long duration. As a variant, the detected electric arc may be discontinuous. It comprises a succession of micro-arcs that are separated by periods without an arc. FIG. 3 shows an example of a discontinuous electric arc during an acquisition window, in this case the window containing the first micro-arcs. In this case, steps E7 to E9 are implemented for each micro-arc. The energy evaluation device 8 identifies the micro-arcs and determines the average value of the voltage measured during each micro-arc, and then evaluates the corresponding current value. It then evaluates the energy of each micro-arc. The device 8 stores the energies evaluated in relation to the identified micro-arcs in memory, and then sums these energies in order to obtain the total energy generated by the electric arc. Test E10 is then implemented in order, where necessary, to order protection of the photovoltaic installation 100.

The invention claimed is:

1. A method for evaluating the electrical energy produced by an electric arc in a photovoltaic installation, the method comprising:
  a) measuring an electric voltage signal across terminals of at least one photovoltaic module of the photovoltaic installation at a sampling frequency greater than or equal to 50 kHz and, from the measured electric voltage signal:
    determining an initial voltage before the electric arc appears;
    determining voltage values during the electric arc;
  b) evaluating values of electric current produced by the photovoltaic installation during the electric arc;
  c) integrating, over time, a product of arc voltage values that are equal to the difference between the voltage values during the electric arc and the initial voltage, which voltage values are determined in the measuring a), and current values evaluated in the evaluating b), in order to determine the energy of the electric arc, and comparing the determined energy of the electric arc with an energy threshold, and performing a protecting action if this threshold is exceeded.

2. The method as claimed in claim 1, wherein, to evaluate a current value during the electric arc, an initial electric current before the electric arc is determined, and there is subtracted, from the initial current, an arc voltage value, which is equal to the difference between a voltage value determined in the measuring a) and the initial voltage, multiplied by a ratio between a magnitude of a current jump linked to an appearance of the electric arc and a magnitude of a voltage jump linked to the appearance of the electric arc.

3. The method as claimed in claim 2, wherein the magnitude of the current jump is equal to a predefined percentage of x % of the initial electric current, x being between 6% and 8%.

4. The method as claimed in claim 3, wherein the magnitude of the voltage jump is predefined and in a range of from 12 V and 35 V.

5. The method as claimed in claim 3, comprising breaking down the voltage signal into a plurality of acquisition windows ($F_x$; $F_i$, $F_{arc}$), each acquisition window containing a number $N_f$ of acquisition points corresponding to sampled voltage values, and, for each acquisition window, determining an average value of the electric voltage signal measured over the acquisition window.

6. The method as claimed in claim 2, wherein the magnitude of the voltage jump is predefined and in a range of from 12 V to 35 V.

7. The method as claimed in claim 6, wherein the following are calculated:
an average arc voltage $V_{arctot}$, by calculating an average of a plurality of determined arc voltage values in relation to a plurality n of acquisition windows covering the electric arc,
an average current $I_{arctot}$ during the electric arc, by calculating an average of a plurality of current values evaluated for the plurality n of acquisition windows;
a total energy produced by the electric arc $E_{arctot}$ using the relationship: $E_{arctot} = V_{arctot} \times I_{arctot} \times n \times 1/F_{ech} \times N_f$ where n, $F_{ech}$, and $N_f$ represent a number of acquisition windows during the arc, a sampling frequency of the measured electric voltage signal and a number of acquisition points in an acquisition window, respectively.

8. The method as claimed in claim 6, wherein the following are calculated:
an arc energy produced by the electric arc during each acquisition window of index arcj using a relationship $E_{Farcj} = V_{arcj} \times I_{Farcj} \times 1/F_{ech} \times N_f$ where $V_{arcj}$, $I_{Farcj}$, $F_{ech}$ and $N_f$ represent an average arc voltage calculated for the acquisition window of index arcj, an average current evaluated for the acquisition window of index arcj, a sampling frequency of the measured electric voltage signal and a number of acquisition points in an acquisition window, respectively;
a total energy produced by the electric arc $E_{arctot}$ by summing arc energies produced over a plurality n of acquisition windows covering the electric arc.

9. The method as claimed in claim 2, wherein the magnitude of the voltage jump is predefined and equal to 20 V.

10. The method as claimed in claim 2, wherein the magnitude of the voltage jump is predefined and in a range of from 12 V and 35 V.

11. The method as claimed in claim 2, comprising breaking down the voltage signal into a plurality of acquisition windows ($F_x$; $F_i$, $F_{arc}$), each acquisition window containing a number $N_f$ of acquisition points corresponding to sampled voltage values, and, for each acquisition window, determining an average value of the electric voltage signal measured over the acquisition window.

12. The method as claimed in claim 1, wherein the evaluated electric current values during the electric arc are values measured at a sampling frequency less than or equal to 1 Hz.

13. The method as claimed in claim 1, comprising breaking down the electric voltage signal into a plurality of acquisition windows ($F_x$; $F_i$, $F_{arcj}$), each acquisition window containing a number $N_f$ of acquisition points corresponding to sampled voltage values, and, for each acquisition window, determining an average value of the sampled voltage values measured over the window.

14. The method as claimed in claim 13, wherein the initial voltage before the arc appears is determined by calculating an average of a plurality of average voltage values in relation to a plurality of acquisition windows before the electric arc.

15. The method as claimed in characterized in that claim 1, wherein the voltage values determined during the electric arc are equal to average voltage values in relation to a succession of acquisition windows.

16. The method as claimed in claim 1, wherein, in the event of a discontinuous electric arc including a plurality of electric micro-arcs, an energy of each electric micro-arc is determined, and then respective energies of the electric micro-arcs are summed in order to determine an energy of the discontinuous electric arc.

17. A device for evaluating energy released by an electric arc in a photovoltaic installation, the device comprising:
a module for obtaining an electric voltage signal measured across terminals of at least one photovoltaic module of the photovoltaic installation at a sampling frequency greater than or equal to 50 kHz;
a module for determining an initial electric current produced by the photovoltaic installation before the electric arc appears;
a module for processing the electric voltage signal, designed to determine, from the measured electric voltage signal:
an initial voltage before the electric arc appears;
voltage values during the electric arc;
a module for evaluating values of electric current produced by the photovoltaic installation during the electric arc;
a module for integrating, over time, a product of arc voltage values that are equal to a difference between the electric voltage values during the electric arc and the initial voltage, which values are determined by the processing module, and current values evaluated by the evaluation module, in order to determine the energy of the electric arc, and
an intervention device intended to protect the photovoltaic installation.

18. A safety system for a photovoltaic installation, the safety system comprising a device for detecting an electric arc, and a device for evaluating electrical energy produced by a detected electric arc as claimed in claim 17.

19. A photovoltaic installation, comprising the safety system as claimed in claim 18.

* * * * *